(12) United States Patent
Okuda et al.

(10) Patent No.: US 11,398,713 B2
(45) Date of Patent: Jul. 26, 2022

(54) ELECTRO-ABSORPTION MODULATOR, OPTICAL SEMICONDUCTOR DEVICE AND OPTICAL MODULE

(71) Applicant: Mitsubishi Electric Corporation, Tokyo (JP)

(72) Inventors: Shinya Okuda, Tokyo (JP); Takashi Nagira, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 193 days.

(21) Appl. No.: 16/755,378

(22) PCT Filed: Dec. 4, 2017

(86) PCT No.: PCT/JP2017/043469
§ 371 (c)(1),
(2) Date: Apr. 10, 2020

(87) PCT Pub. No.: WO2019/111295
PCT Pub. Date: Jun. 13, 2019

(65) Prior Publication Data
US 2021/0175682 A1 Jun. 10, 2021

(51) Int. Cl.
*H01S 5/026* (2006.01)
*G02F 1/015* (2006.01)
*H01S 5/40* (2006.01)

(52) U.S. Cl.
CPC ............ *H01S 5/0265* (2013.01); *G02F 1/015* (2013.01); *H01S 5/4068* (2013.01)

(58) Field of Classification Search
CPC ...... H01S 5/0265; H01S 5/0625–06258; H01S 5/18302; H01S 5/4068; H01S 5/02253;
(Continued)

(56) References Cited

U.S. PATENT DOCUMENTS 5,115,335 A * 5/1992 Soref ................ H01L 27/14643
359/248
5,358,896 A * 10/1994 Komatsu ................ G02B 6/124
372/45.01
(Continued)

FOREIGN PATENT DOCUMENTS

CN      1976078 A  *  6/2007  ............. H01L 33/26
CN    103247708 A      8/2013
(Continued)

OTHER PUBLICATIONS

Li et al., "First Principles Study of Bismuth Alloying Effects in GaAs Saturable Absorber", May 7, 2012, Optics Express, vol. 20, No. 10, 11574-11580. (Year: 2012).*
(Continued)

*Primary Examiner* — Joshua King
(74) *Attorney, Agent, or Firm* — Studebaker & Brackett PC (57) ABSTRACT

An electro-absorption modulator of the invention is an electro-absorption modulator which is formed on an InP substrate and modulate incident light according to a voltage applied to that modulator, and which comprises a light absorbing layer for absorbing a portion of the incident light by using an electric field generated by the applied voltage; wherein the light absorbing layer is comprised of a ternary or more complex III-V semiconductor mixed crystal that does not contain Al but contains Bi.

20 Claims, 8 Drawing Sheets

(58) Field of Classification Search
CPC .... H01S 5/0231; H01S 5/02212; G02F 1/015;
G02F 1/0155–0159; G02F 2202/101;
G02F 2202/102; G02F 1/0157–0159

See application file for complete search history.

(56) References Cited

U.S. PATENT DOCUMENTS

| | | | | |
|---|---|---|---|---|
| 5,822,352 | A * | 10/1998 | Mizutani | H01S 5/5009 372/50.122 |
| 6,055,251 | A * | 4/2000 | Ouchi | H01S 5/06255 372/26 |
| 6,417,520 | B1 * | 7/2002 | Kano | H01L 33/10 257/13 |
| 6,495,384 | B1 * | 12/2002 | Morimoto | H01S 5/12 216/24 |
| 6,501,776 | B1 * | 12/2002 | Numai | H01S 5/068 372/45.01 |
| 6,567,439 | B1 * | 5/2003 | Auracher | H01L 24/49 372/36 |
| 8,687,665 | B1 * | 4/2014 | Tauke-Pedretti | H01S 5/06256 372/97 |
| 2002/0163002 | A1 * | 11/2002 | Takagi | H01S 5/0265 257/79 |
| 2003/0219055 | A1 * | 11/2003 | Chua | H01S 5/4068 372/50.121 |
| 2004/0141535 | A1 * | 7/2004 | Sunaga | H01S 5/02253 372/29.02 |
| 2004/0179569 | A1 * | 9/2004 | Sato | H01S 5/4068 372/50.11 |
| 2004/0240497 | A1 * | 12/2004 | Oomori | H01S 5/02212 372/36 |
| 2007/0235715 | A1 * | 10/2007 | Makino | B82Y 20/00 257/13 |
| 2008/0137178 | A1 * | 6/2008 | Chung | G02F 1/025 359/321 |
| 2009/0166807 | A1 * | 7/2009 | Yamatoya | G02B 6/124 257/615 |
| 2010/0246629 | A1 * | 9/2010 | Fujii | H01S 5/4068 372/50.121 |
| 2012/0128017 | A1 * | 5/2012 | Felser | H01L 31/072 372/44.01 |
| 2012/0168816 | A1 * | 7/2012 | Sweeney | H01S 5/343 257/103 |
| 2012/0281723 | A1 * | 11/2012 | Oh | H01S 5/02325 372/20 |
| 2013/0207160 | A1 * | 8/2013 | Sasahata | H01L 31/1844 257/186 |
| 2014/0269802 | A1 * | 9/2014 | Johnson | H01S 5/34346 372/45.01 |
| 2015/0109680 | A1 * | 4/2015 | Vorndran | H01S 5/0071 359/641 |
| 2015/0155420 | A1 * | 6/2015 | Webster | H01L 31/035236 257/13 |
| 2015/0236477 | A1 * | 8/2015 | Kitatani | H01S 5/2275 372/45.012 |
| 2015/0318667 | A1 * | 11/2015 | Johnson | H01S 5/06243 372/26 |
| 2017/0031118 | A1 * | 2/2017 | Kanan | G02B 6/4263 |
| 2019/0273361 | A1 * | 9/2019 | Siriani | H01S 5/34 |

FOREIGN PATENT DOCUMENTS

| | | | | |
|---|---|---|---|---|
| CN | 109449223 | A * | 3/2019 | |
| CN | 112072467 | A * | 12/2020 | ........... H01S 5/2004 |
| EP | 3407122 | A1 * | 11/2018 | ............. G02F 1/017 |
| JP | H09008405 | A | 1/1997 | |
| JP | H11068238 | A | 3/1999 | |
| JP | 2000223787 | A | 8/2000 | |
| JP | 2004221413 | A | 8/2004 | |
| JP | 2004235600 | A * | 8/2004 | ............. H01S 5/227 |
| JP | 2005505125 | A * | 2/2005 | |
| JP | 2010114295 | A | 5/2010 | |
| JP | 2013165164 | A | 8/2013 | |
| KR | 1998-050976 | A | 9/1998 | |
| KR | 100228396 | B1 * | 11/1999 | |
| TW | I553980 | B * | 10/2016 | |
| WO | WO-2004105202 | A1 * | 12/2004 | ........... H01S 5/2231 |
| WO | WO-2009119172 | A1 * | 10/2009 | ......... H01S 5/18341 |
| WO | WO-2010149978 | A1 * | 12/2010 | ............. H01L 33/30 |

OTHER PUBLICATIONS

Gladysiewicz et al., "Electronic band structure and material gain of III-V-Bi quantum wells grown on GaSb substrate and dedicated for mid-infrared spectral range", Feb. 18, 2016, J. Appl. Phys. 119, 075701. (Year: 2016).*

Wang et al., "Growth of semiconductor alloy InGaPBi on InP by molecular beam epitaxy", Jun. 22, 2015, Semicond. Sci. Technol. 30, 094006. (Year: 2015).*

Zhang et al., "Similar and dissimilar aspects of III-V semiconductors containing Bi versus N", 2005, Physical Review B, 155201. (Year: 2005).*

Devenson et al., "Structure and Optical Properties of InGaAsBi with up to 7% Bismuth", 2012, Appl. Phys. Express, 5, 015503. (Year: 2012).*

Chen et al., "Characteristics of InGaAsBi with various lattice mismatches on InP substrate" 2016, AIP Advances, 6, 075215. (Year: 2016).*

International Search Report issued in PCT/JP2017/043469; dated Feb. 27, 2018.

An Office Action mailed by China National Intellectual Property Administration dated Dec. 31, 2021, which corresponds to Chinese Patent Application No. 201780097327.7 and is related to U.S. Appl. No. 16/755,378; with English language translation.

* cited by examiner

ELECTRO-ABSORPTION MODULATOR, OPTICAL SEMICONDUCTOR DEVICE AND OPTICAL MODULE

TECHNICAL FIELD

The present invention relates to an electro-absorption modulator which is less temperature-dependent and is thus capable of so-called uncooled operation.

BACKGROUND ART

In a conventional electro-absorption modulator which is used for optical communication and formed on an InP substrate, InGaAsP or AlGaInAs is generally used for a light absorbing layer for absorbing light (for example, Patent Document 1). The bandgap of such a material varies largely in response to change in ambient temperature. Thus, in order to obtain intended characteristics, the modulator is equipped with a Peltier cooler as a temperature adjustment system and is used while being controlled at a constant temperature, for example, at about 50° C. to 60° C., or the modulator is equipped with a system for adjusting a bias voltage of the electro-absorption modulator at the time the temperature changes.

Unlike the electro-absorption modulator, according to a semiconductor laser, when its oscillation wavelength is designed adequately, even if its gain spectrum varies due to temperature change, it is possible to obtain a sufficient gain and thus to continue oscillating. Further, a light receiving element, when the bandgap of its light absorbing layer is designed adequately, functions sufficiently even if the bandgap varies due to temperature change. As just described, according to the semiconductor laser or the light receiving element, the temperature dependence of characteristics is small, so that so-called uncooled operation without requiring temperature adjustment by a temperature adjustment system is easily performed.

On the other hand, for the electro-absorption modulator, in order to obtain intended characteristics, it is required to control its absorption spectrum in the order of several nanometers, so that such a temperature adjustment system or bias-voltage adjustment system is inevitably required. This increases power consumption, complexity and cost. Thus, uncooled operation is desired also for the electro-absorption modulator.

It has been reported that, according to a III-V semiconductor mixed crystal containing Bismuth (Bi), the temperature-dependent variation of the bandgap is reduced in accordance with the amount of Bi and, in particular, InGaAsBi shows a bandgap (0.6-1.5 eV) that is constant against temperature change (for example, Patent Document 2). Also, a semiconductor laser has been reported which achieved improvement in temperature characteristics by using InGaAsBi (for example, Patent Documents 3 and 4).

A semiconductor laser element has been reported in which its active layer is constituted of a short-period superlattice which comprises thin films as constitution units, each made of two kinds of III-V semiconductors or a mixed crystal thereof, and among these thin films, a thin film whose lattice constant is largest contains Bi (for example, Patent Document 5). For example, the semiconductor laser element of Patent Document 5 employs for the active layer, a short-period superlattice of $(InAsBi)_m(GaAs)_n$ in which Bi is contained in InAs that is one of InAs and GaAs and whose lattice constant is larger than the other.

CITATION LIST

Patent Document

Patent Document 1: Japanese Patent Application Laid-open No. 2010-114295 (Paragraph 0074; FIGS. 3 to 14)
Patent Document 2: Japanese Patent Application Laid-open No. H09-8405 (Paragraph 0008; FIG. 1, FIG. 3)
Patent Document 3: Japanese Patent Application Laid-open No. 2000-223787 (Paragraph 0031; FIG. 1)
Patent Document 4: Japanese Patent Application Laid-open No. 2004-221413 (paragraph 0023; FIG. 1)
Patent Document 5: Japanese Patent Application Laid-open No. H11-68238 (paragraphs 0006, 0007; FIG. 1)

SUMMARY OF THE INVENTION

Problems to be Solved by the Invention

In Patent Document 1, a semiconductor mixed crystal containing aluminum (Al) is used as an electro-absorption modulator portion EA in a light waveguide element. Al is a highly reactive material and is likely to be oxidized or corroded. When Al is oxidized during crystal growth of the light absorbing layer, abnormal growth occurs, thus producing many defects. According to such a modulator (electro-absorption modulator portion EA), during its operation, crystal deterioration proceeds from the portions of these defects as base points, thus causing degradation of reliability thereof. Accordingly, for the modulator (electro-absorption modulator portion EA) of Patent Document 1, during the crystal growth, it is required to strictly control such that no oxygen is contained in gas pipes and a reaction chamber of a deposition apparatus, and thus the growth condition is more severe than that for the material not containing Al, resulting in increased cost.

Since Al is particularly sensitive to humidity, it is required to prevent the facet of the crystal from directly contacting outer air, so that manufacturing cost and storage cost increase. Further, Al has a eutectic point with silicon (Si) of 530° C. Thus, in silicon photonics which is a systemized technology for fabricating an electronic integrated circuit and an optical integrated circuit concurrently on Si, such a case may arise where Al melts into Si partly and deeply at a high temperature in chip manufacturing steps, to form a pit. This causes degradation of reliability of the semiconductor device in which the electronic integrated circuit and the optical integrated circuit are formed.

This invention has been made to solve the problems as described above, and an object thereof is to achieve an electro-absorption modulator which is less temperature-dependent and which is superior in reliability.

Means for Solving the Problems

An electro-absorption modulator of the invention is an electro-absorption modulator which is formed on an InP substrate and modulates incident light according to a voltage applied to that modulator, and which comprises a light absorbing layer for absorbing a portion of the incident light by using an electric field generated by the applied voltage; wherein the light absorbing layer is comprised of a ternary or more complex III-V semiconductor mixed crystal that does not contain Al but contains Bi.

Effect of the Invention

Since the light absorbing layer is comprised of a ternary or more complex III-V semiconductor mixed crystal that does not contain Al but contains Bi, the electro-absorption modulator of the invention is less temperature-dependent and can improve its reliability.

MODES FOR CARRYING OUT THE INVENTION

Embodiment 1

Figure 1:
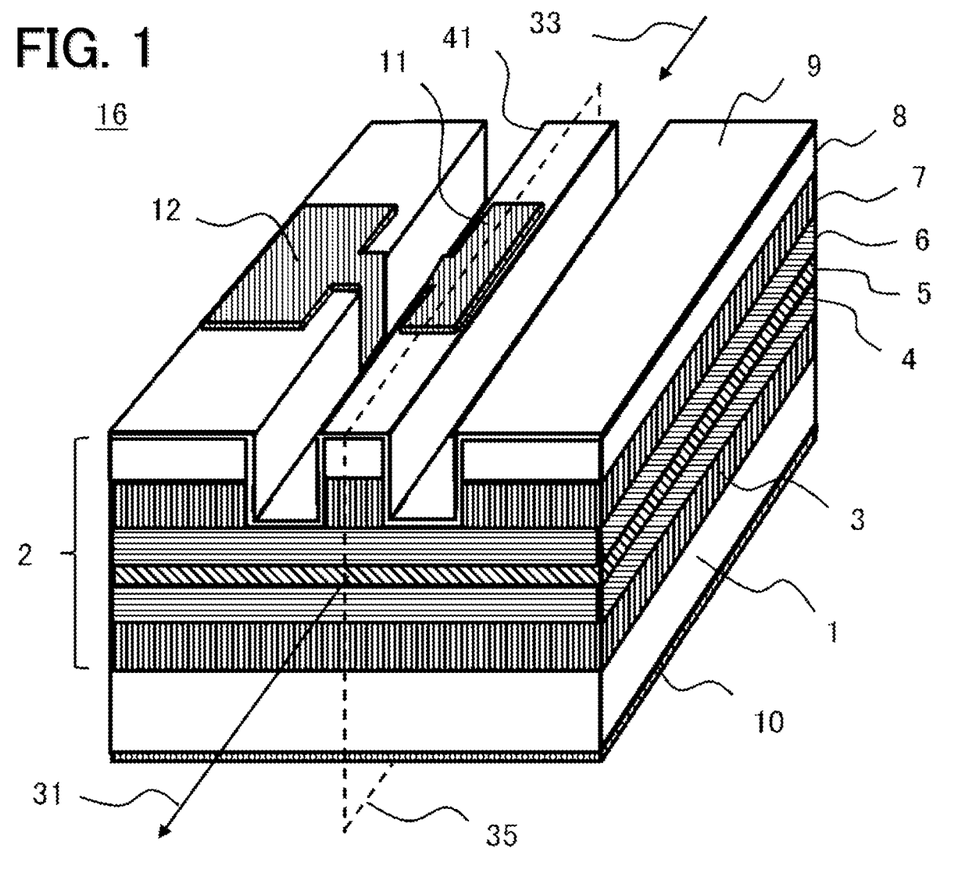
FIG. 1 is a perspective view showing an electro-absorption modulator according to Embodiment 1 of the invention.
Figure 2:
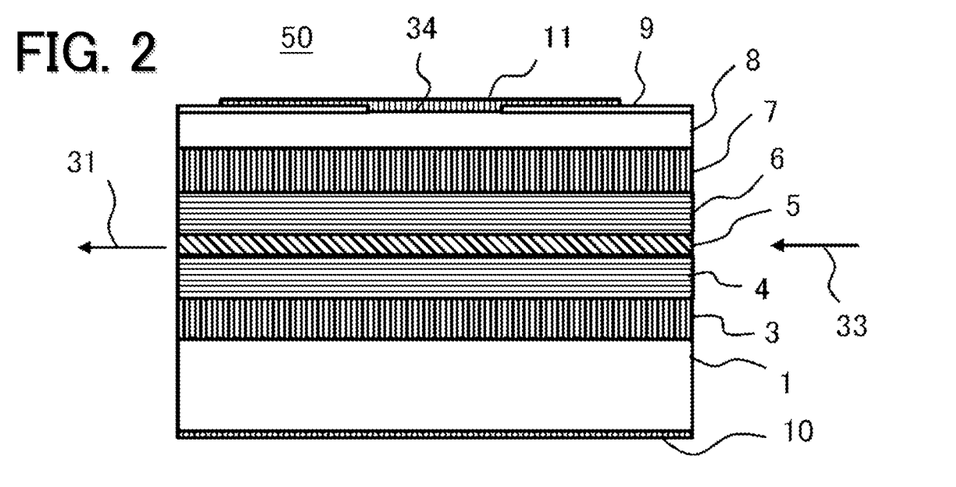
FIG. 2 is a main part cross-sectional view along an optical axis direction in FIG. 1.
Figure 3:
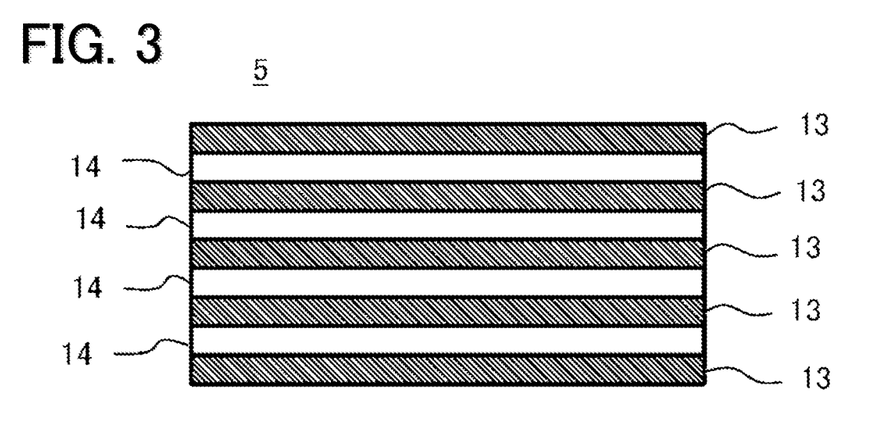
FIG. 3 is a diagram showing a cross-sectional structure of a light absorbing layer in FIG. 2.

FIG. 1 is a perspective view showing an electro-absorption modulator according to Embodiment 1 of the invention. FIG. 2 is a main part cross-sectional view along an optical axis direction in FIG. 1, and FIG. 3 is a diagram showing a cross-sectional structure of a light absorbing layer in FIG. 2. The cross-sectional view of FIG. 2 is a view cut along a broken-line plane 35 parallel to an optical axis 31 as a light-traveling axis. An electro-absorption modulator of Embodiment 1 includes: an n-type InP substrate 1; a semiconductor stacked structure 2 provided on an upper face (top face) of the InP substrate 1; an insulating film 9 made of $SiO_2$ and provided on the semiconductor stacked structure 2; an n-side electrode 10 provided on a lower face (back face) of the InP substrate 1; and a p-side electrode 11 connected through an opening portion 34 of the insulating film 9 to the semiconductor stacked structure 2. As shown in FIG. 1, the semiconductor stacked structure 2 is provided with a ridge-type waveguide 41. The semiconductor stacked structure 2 has: an n-type cladding layer (first cladding layer) 3 made of n-type InP; an i-type InGaAsP light-waveguide layer (first light-waveguide layer) 4; an i-type InGaAsBi light absorbing layer 5; a p-type light-waveguide layer (second light-waveguide layer) 6 made of p-type InGaAsP; a p-type cladding layer (second cladding layer) 7 made of p-type InP; and a p-type contact layer 8 made of p-type InGaAs; which are stacked on the n-type InP substrate 1 in that order. The i-type InGaAsBi light absorbing layer 5 is lattice-matched to the InP substrate 1. Note that, here, the term "lattice-matched" means that the lattice mismatch rate is 0.5% or less.

As shown in FIG. 3, the i-type InGaAsBi light absorbing layer 5 has an InGaAsBi/InGaAsP multiple quantum-well (MQW; Multiple Quantum Well) structure in which InGaAsBi quantum-well layers 13 and InGaAsP barrier layers 14 are stacked alternately. In FIG. 3, a case is shown where the light absorbing layer 5 has five quantum-well layers 13 and four barrier layers 14. The insulating film 9 is provided on a surface of the p-type contact layer 8 of P-type InGaAs as the uppermost layer in the semiconductor stacked structure 2. The p-side electrode 11 made of Ti/Au or the like, is electrically connected through a portion of the p-type contact layer 8 of p-type InGaAs that constitutes a top part of the ridge-type waveguide 41, to the p-type cladding layer 7 of p-type InP and to the p-type light-waveguide layer 6 of p-type InGaAsP. The n-side electrode 10 made of AuGe/Au is connected to the back face (lower face) of the n-type InP substrate 1. Here, the wavelength of incident light 33 is, for example, 1.55 μm that is within the optical communication wavelength band. The incident light 33 enters from the end-face side in FIG. 1.

Next, a manufacturing method of the electro-absorption modulator 16 according to this embodiment will be described briefly. First, using a MOCVD (Metal Organic Chemical Vapor Deposition) method or the like, the n-type cladding layer 3 of n-type InP, the i-type InGaAsP light-waveguide layer 4, the i-type InGaAsBi light absorbing layer 5, the p-type light-waveguide layer 6 of p-type InGaAsP, the p-type cladding layer 7 of p-type InP and the p-type contact layer 8 of p-type InGaAs, are epitaxially grown in this order on the n-type InP substrate 1. The i-type InGaAsBi light absorbing layer 5 is provided by epitaxially growing the InGaAsBi quantum-well layers 13 and the InGaAsP barrier layers 14 alternately.

Then, the insulating film 9 of $SiO_2$ is formed by a plasma CVD method or the like, on the p-type contact layer 8 of p-type InGaAs. By applying a photolithographic technique and etching using hydrofluoric acid or the like in combination, the opening portion 34 is created in a region of the insulating film 9 where the p-side electrode 11 is to be connected to the p-type contact layer 8. Thereafter, a Ti/Au film is formed by electron beam (EB) evaporation, and an unwanted portion of that film is lifted off together with the photoresist film, so that the p-side electrode 11 is formed. At this time, a bonding pad 12 connected to the p-side electrode 11 is simultaneously formed on the insulating film 9. Thereafter, the lower face of the n-type InP substrate 1 is polished and then the n-side electrode 10 is formed on the lower face of the n-type InP substrate 1. According to the above process flow, the electro-absorption modulator 16 according to this embodiment is manufactured.

Description will be made about basic operations of the electro-absorption modulator 16 according to this embodiment. When a reverse bias by which the n-side electrode 10 becomes the plus side and the p-side electrode 11 becomes the minus side, is externally applied, the absorption spectrum of the i-type InGaAsBi light absorbing layer 5 varies, so that a light absorption phenomenon occurs. The incident light 33 having entered from the end-face side of the electro-absorption modulator 16 is partly absorbed in the i-type InGaAsBi light absorbing layer 5 according to the voltage of the reverse bias, so that pairs of electrons and holes are generated. When almost all of the incident light 33 is absorbed by the light absorption phenomenon in the light absorbing layer 5, the incident light 33 is quenched, namely, it is substantially not emitted from the electro-absorption modulator 16. The electro-absorption modulator 16 controls emission and non-emission of the incident light 33, namely, it modulates the incident light 33. These electrons and holes can be extracted as a current to the outside through the p-side electrode 11 and the n-side electrode 10. This current is referred to as a photoelectric current. Note that the light absorption amount in the electro-absorption modulator 16 varies depending on the value of a voltage applied to the light absorbing layer 5 that is due to an external voltage applied between the p-side electrode 11 and the n-side electrode 10. When a specified reverse-bias voltage is applied to the electro-absorption modulator 16, the incident light 33 is not emitted from the electro-absorption modulator 16, and when the specified reverse-bias voltage is not applied to the electro-absorption modulator 16, the incident light 33 is emitted from the electro-absorption modulator 16.

Figure 4:
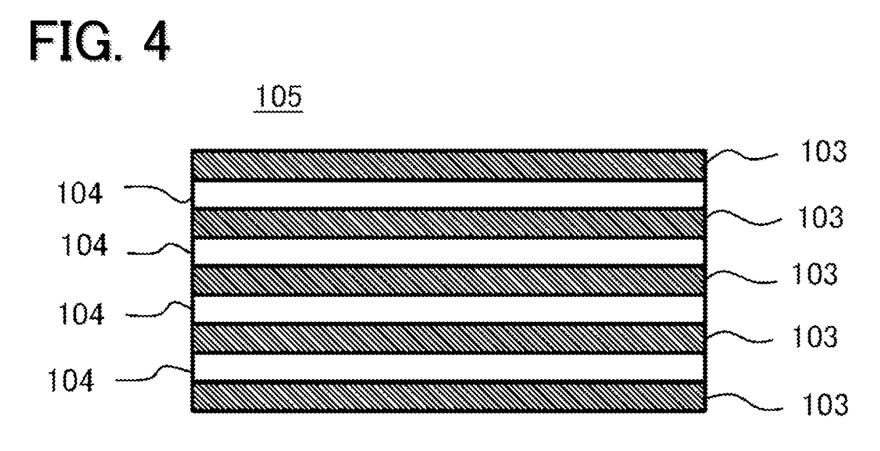
FIG. 4 is a diagram showing a cross-sectional structure of a light absorbing layer as a comparative example 1.

Effects of this embodiment will be described as compared to a comparative example. FIG. 4 is a diagram showing a cross-sectional structure of a light absorbing layer as a comparative example 1. In the comparative example 1, the material of a light absorbing layer 105, namely, the material of quantum-well layers 103 and barrier layers 104, is i-type AlGaInAs. An electro-absorption modulator is required to exhibit constant characteristics without being affected by an external temperature change. However, with respect to AlGaInAs, when its temperature is changed, the bandgap varies and thus the absorption spectrum varies. This may result in change of the modulator characteristics of the electro-absorption modulator having the AlGaInAs light absorbing layer 105.

Unlike the comparative example 1, the electro-absorption modulator 16 of Embodiment 1, since the bandgap of InGaAsBi in the light absorbing layer 5 is stable against temperature change, can reduce change of the characteristics at a low temperature or a high temperature, and is thus capable of uncooled operation. Further, in the electro-absorption modulator 16 of Embodiment 1, the light absorbing layer 5 does not contain Al, so that it is easy to achieve crystal growth of the light absorbing layer 5. In the electro-absorption modulator 16 of Embodiment 1, since crystalline oxidation does not occur in the light absorbing layer 5 not containing Al, generation of crystal defects in the light absorbing layer 5 is suppressed, so that it is possible to prevent degradation of the reliability. Further, in the electro-absorption modulator 16 of Embodiment 1, since InGaAsBi is lattice-matched to the n-type InP substrate 1, generation of crystal defects due to strain is also suppressed.

The quantum-well layer 13 in the light absorbing layer 5 may use another III-V semiconductor than InGaAsBi, since it only has to contain Bi. For example, it is allowable to use an InGaPBi-based mixed crystal, an InGaAsPBi-based mixed crystal or the like. Further, each quantum-well layer 13 is not limited to a single layer, and may be formed of multiple layers in which such materials are used in combination.

As described above, the electro-absorption modulator 16 of Embodiment 1 is an electro-absorption modulator which is formed on the InP substrate 1 and modulates the incident light 33 according to a voltage applied to that modulator, and which comprises the light absorbing layer 5 for absorbing a portion of the incident light 33 by using an electric field generated by the applied voltage. The light absorbing layer 5 of the electro-absorption modulator 16 of Embodiment 1 is comprised of a ternary or more complex III-V semiconductor mixed crystal that does not contain Al but contains Bi. Since the light absorbing layer 5 is comprised of a ternary or more complex III-V semiconductor mixed crystal that does not contain Al but contains Bi, the electro-absorption modulator 16 of Embodiment 1 is less temperature-dependent and can improve its reliability.

Further, in the electro-absorption modulator 16 of Embodiment 1, the light absorbing layer 5 has a multiple quantum-well structure in which the quantum-well layers 13 and the barrier layers 14 are stacked alternately, and the quantum-well layers 13 are each comprised of a ternary or more complex III-V semiconductor mixed crystal that does not contain Al but contains Bi. Since Al is not contained in the quantum-well layers 13 in the light absorbing layer 5 but Bi is contained therein, and Al is not contained in the barrier layers 14 in the light absorbing layer 5, the electro-absorption modulator 16 of Embodiment 1 is less temperature-dependent and can improve its reliability.

Embodiment 2

Figure 5:
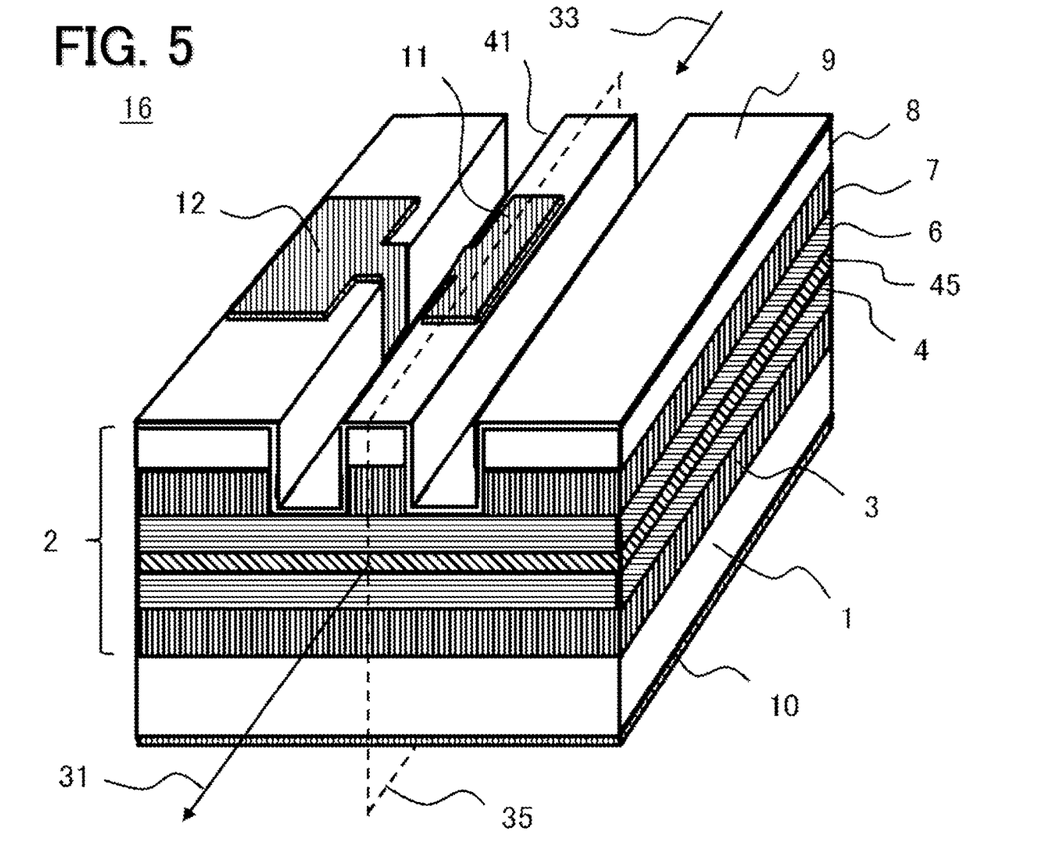
FIG. 5 is a perspective view showing an electro-absorption modulator according to Embodiment 2 of the invention.
Figure 6:
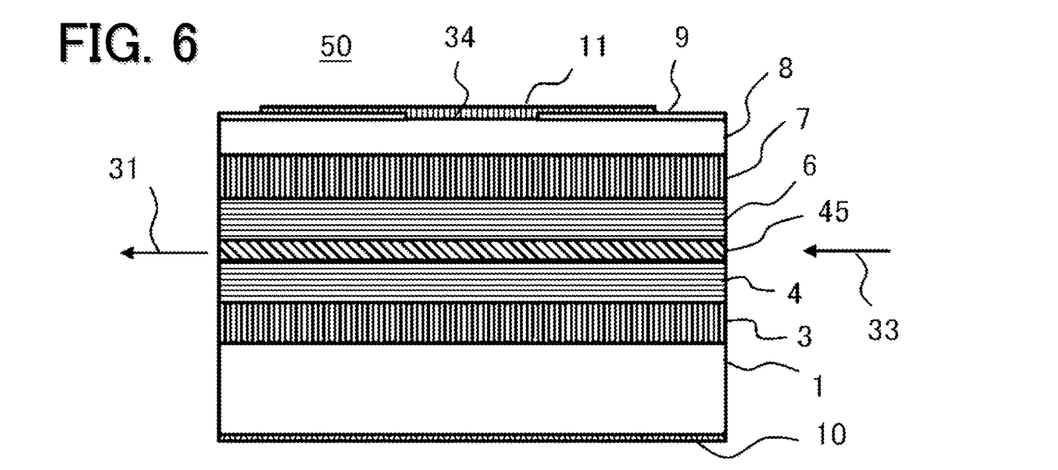
FIG. 6 is a main part cross-sectional view along an optical axis direction in FIG. 5.
Figure 7:
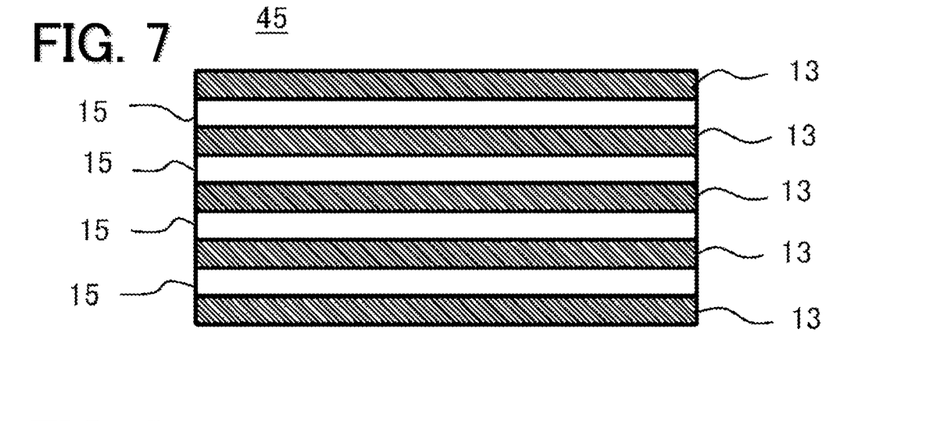
FIG. 7 is a diagram showing a cross-sectional structure of a light absorbing layer in FIG. 6.

FIG. 5 is a perspective view showing an electro-absorption modulator according to Embodiment 2 of the invention. FIG. 6 is a main part cross-sectional view along an optical axis direction in FIG. 5, and FIG. 7 is a diagram showing a cross-sectional structure of a light absorbing layer in FIG. 6. The cross-sectional view of FIG. 6 is a view cut along a broken-line plane 35 parallel to an optical axis 31 as a light-traveling axis. An electro-absorption modulator 16 of Embodiment 2 differs from the electro-absorption modulator 16 of Embodiment 1 in that the light absorbing layer in the semiconductor stacked structure 2 is another light absorbing layer 45. The light absorbing layer 45 has an InGaAsBi/AlGaInAs multiple quantum-well structure.

As shown in FIG. 7, the light absorbing layer 45 has such an InGaAsBi/AlGaInAs multiple quantum-well structure in which InGaAsBi quantum-well layers 13 and AlGaInAs barrier layers 15 are stacked alternately. The quantum-well layers 13 are each comprised of InGaAsBi, and the barrier layers 15 are each comprised of AlGaInAs.

According to the electro-absorption modulator 16 of Embodiment 2, the quantum-well layers 13 in the light absorbing layer 45 are each comprised of InGaAsBi, so that, like in Embodiment 1, the temperature dependence of the absorption spectrum of the modulator is eliminated and thus uncooled operation thereof is allowed. According to the electro-absorption modulator 16 of Embodiment 2, since the barrier layers 15 in the light absorbing layer 45 are each comprised of AlGaInAs having a large conduction-band offset, a stable operation can be ensured even at a high temperature.

The quantum-well layer 13 in the light absorbing layer 45 may use another III-V semiconductor than InGaAsBi, since it only has to be free of Al and contain Bi. For example, it is allowable to use an InGaPBi-based mixed crystal, an InGaAsPBi-based mixed crystal or the like. Further, each quantum-well layer 13 is not limited to a single layer, and may be formed of multiple layers in which such materials are used in combination. The barrier layer 15 may use another III-V semiconductor than AlGaInAs, since it only has to contain Al. For example, it is allowable to use an AlGaInAsP-based mixed crystal or the like. Further, each barrier layer 15 is not limited to a single layer, and may be formed of multiple layers in which such materials are used in combination.

Since Al is not contained in the quantum-well layers 13 of the light absorbing layer 45 but Bi is contained therein, whereas Al is contained in the barrier layers 15 of the light absorbing layer 45, the electro-absorption modulator 16 of Embodiment 2 is less temperature-dependent and can improve its reliability. Further, according to the electro-absorption modulator 16 of Embodiment 2, since Al is contained in the barrier layers 15 of the light absorbing layer 45, a stable operation can be ensured even at a high temperature, that is more stable than that of the electro-absorption modulator 16 of Embodiment 1.

As described above, the electro-absorption modulator 16 of Embodiment 2 is an electro-absorption modulator which is formed on the InP substrate 1 and modulates the incident light 33 according to a voltage applied to that modulator, and which comprises the light absorbing layer 45 for absorbing a portion of the incident light 33 by using an electric field generated by the applied voltage. The light absorbing layer 45 of the electro-absorption modulator 16 of Embodiment 2 has a multiple quantum-well structure in which the quantum-well layers 13 and the barrier layers 15 are stacked alternately; the quantum-well layers 13 are each comprised of a ternary or more complex III-V semiconductor mixed crystal that does not contain Al but contains Bi; and the barrier layers 15 are each comprised of a ternary or more complex III-V semiconductor mixed crystal that does not contain Bi but contains Al. Since the quantum-well layers 13 in the light absorbing layer 45 are each comprised of a ternary or more complex III-V semiconductor mixed crystal that does not contain Al but contains Bi, the electro-absorption modulator 16 of Embodiment 2 is less temperature-dependent and can improve its reliability.

Embodiment 3

Figure 8:
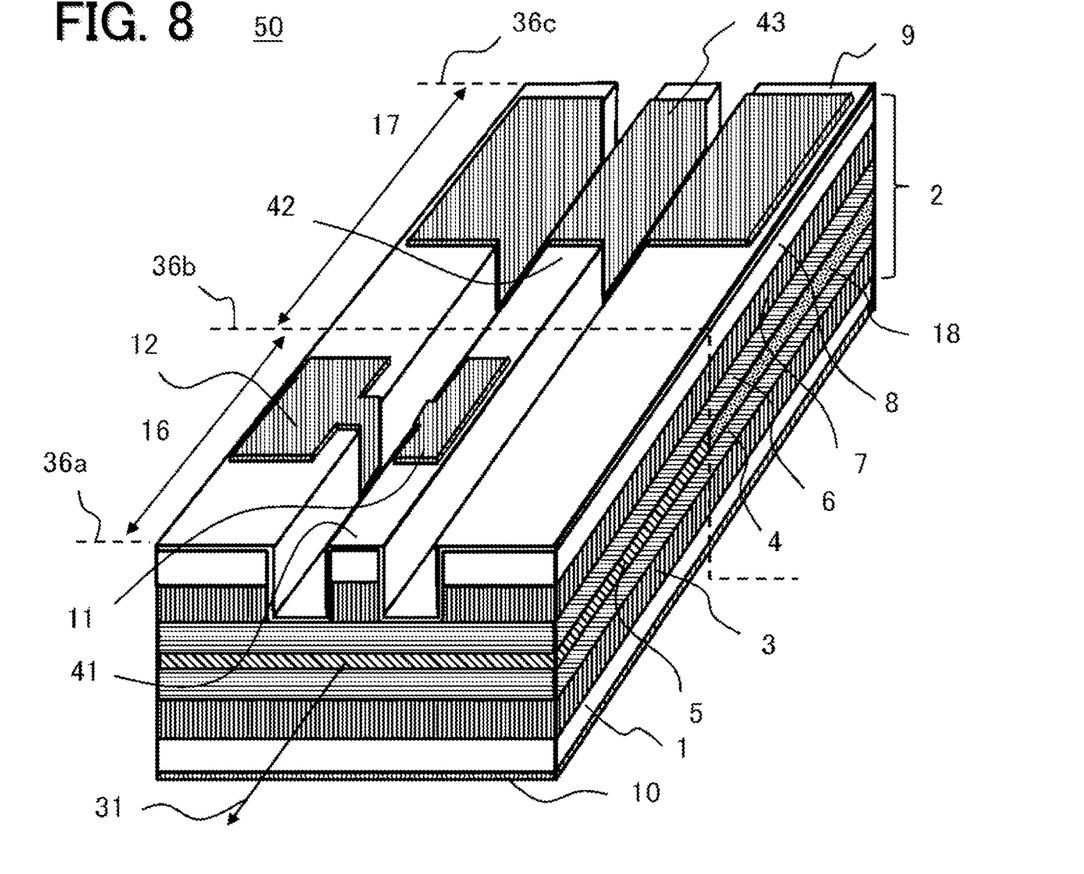
FIG. 8 is a perspective view showing an optical semiconductor device according to Embodiment 3 of the invention.
Figure 9:
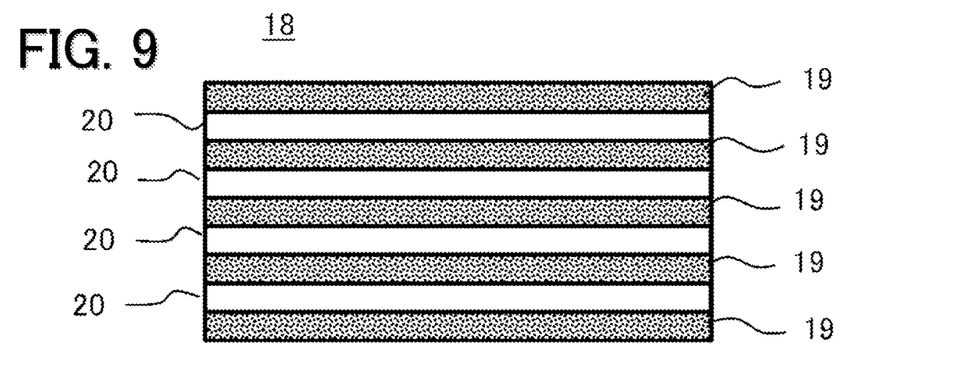
FIG. 9 is a diagram showing a cross-sectional structure of an active layer in a semiconductor laser in FIG. 8.

FIG. 8 is a perspective view showing an optical semiconductor device according to Embodiment 3 of the invention, and FIG. 9 is a diagram showing a cross-sectional structure of an active layer in a semiconductor laser in FIG. 8. An optical semiconductor device 50 of Embodiment 3 is an optical semiconductor device in which an electro-absorption modulator 16 and a distributed feedback (DFB; Distributed Feedback) semiconductor laser 17 are integrated on an n-type InP substrate 1. This electro-absorption modulator 16 is the same as the electro-absorption modulator 16 of Embodiment 1 or the electro-absorption modulator 16 of Embodiment 2. Note that, in FIG. 8, a case is shown where the light absorbing layer in the electro-absorption modulator 16 is the light absorbing layer 5 in Embodiment 1. The semiconductor laser 17 has an active layer 18. In the semiconductor laser 17, a semiconductor stacked structure 2 from an n-type cladding layer 3 to a p-type contact layer 8 corresponds to the structure in the electro-absorption modulator 16 provided that the light absorbing layer 5 is substituted with the active layer 18. The electro-absorption modulator 16 has a ridge-type waveguide 41, and the semiconductor laser 17 has a ridge-type waveguide 42. The ridge-type waveguide 41 and the ridge-type waveguide 42 are continuous with each other. A broken line 36b is a broken line having portions thereof that are parallel, respectively, to the surface boundary and the boundary on the cross-sectional structure between the light absorbing layer 5 and the active layer 18. A broken line 36a indicates an end on the side where light is emitted, and a broken line 36c indicates an end on the side where light is incident. The semiconductor laser 17 corresponds to a region from the broken line 36b to the broken line 36c, and the electro-absorption modulator 16 corresponds to a region from the broken line 36a to the broken line 36b.

The semiconductor laser 17 includes: an n-type InP substrate 1; the semiconductor stacked structure 2 provided on an upper face (top face) of the InP substrate 1; an insulating film 9 made of $SiO_2$ and provided on the semiconductor stacked structure 2; an n-side electrode 10 provided on a lower face (back face) of the InP substrate 1; and a p-side electrode 11 connected to the semiconductor stacked structure 2. The semiconductor stacked structure 2 has: an n-type cladding layer (first laser cladding layer) 3 made of n-type InP; an i-type InGaAsP light-waveguide layer (first laser light-waveguide layer) 4; the active layer 18; a p-type light-waveguide layer (second laser light-waveguide layer) 6 of p-type InGaAsP; a p-type cladding layer (second laser cladding layer) 7 made of p-type InP; and a p-type contact layer 8 made of p-type InGaAs; which are stacked on the n-type InP substrate 1 in that order. The first laser cladding layer (the n-type cladding layer 3), the first laser light-waveguide layer (the light-waveguide layer 4), the active layer 18; the second laser light-waveguide layer (the p-type light-waveguide layer 6) and the second laser cladding layer (the p-type cladding layer 7) in the semiconductor laser 17, are connected, respectively, to the first cladding layer (the n-type cladding layer 3), the first light-waveguide layer (the light-waveguide layer 4), the light absorbing layer 5, 45; the second light-waveguide layer (the p-type light-waveguide layer 6) and the second cladding layer (the p-type cladding layer 7) in the electro-absorption modulator 16.

As shown in FIG. 9, the active layer 18 in the semiconductor laser 17 has an InGaAsP/InGaAsP multiple quantum-well structure in which InGaAsP quantum-well layers 19 and InGaAsP barrier layers 20 are stacked alternately. In FIG. 9, a case is shown where the light absorbing layer 18 has five quantum-well layers 19 and four barrier layers 20. The manufacturing steps of the optical semiconductor device 50 of Embodiment 3 are similar to the manufacturing steps of the electro-absorption modulator 16 described in Embodiment 1. However, the light absorbing layer 5 of the electro-absorption modulator 16 and the active layer 18 of the semiconductor layer 17 are not formed simultaneously but formed individually.

According to such an optical semiconductor device in which a modulator and a laser are integrated, namely, the optical semiconductor device 50 of Embodiment 3 in which the electro-absorption modulator 16 and the semiconductor laser 17 are integrated, since the structure according to Embodiment 1 or Embodiment 2 is employed for the electro-absorption modulator 16, it is possible to accomplish effects similar to those in Embodiment 1 or Embodiment 2.

With respect to an optical semiconductor device in which a modulator and a laser are integrated, in order to obtain the intended optical power, extinction ratio, transmission penalty, etc. of the modulator, an accuracy in the order of several nanometers is required for a difference ΔA between the oscillation wavelength of the laser and the absorption wavelength of the modulator. For that reason, in the optical semiconductor device 50 of Embodiment 3, a III-V semiconductor not containing Bi is used for the active layer 18 of the semiconductor laser 17, to thereby make the oscillation wavelength of the semiconductor laser 17 have temperature dependence. On the other hand, the structure according to Embodiment 1 or Embodiment 2 is employed for the electro-absorption modulator 16, to thereby make the absorption wavelength, that is a wavelength of light to be absorbed by the electro-absorption modulator 16, not have temperature dependence. Therefore, according to the optical semiconductor device 50 of Embodiment 3, it is possible, by changing the temperature, to change the oscillation wavelength of the laser while keeping the absorption wavelength of the electro-absorption modulator 16 unchanged. Namely, according to the optical semiconductor device 50 of Embodiment 3, it is possible, by changing the temperature, to compensate the oscillation wavelength of the laser while keeping the absorption wavelength of the electro-absorption modulator 16 unchanged. Furthermore, according to the optical semiconductor device 50 of Embodiment 3, it is possible, by temperature modulation, to compensate a deviation of AA between the oscillation wavelength of the semiconductor laser 17 and the absorption wavelength of the electro-absorption modulator 16, that is due to an error in their production, so that the required production accuracy is mitigated.

The active layer 18 in the semiconductor laser 17 may use another III-V semiconductor than InGaAsP, since it only has to be free of Bi. For example, it is allowable to use an AlGaInAs-based mixed crystal or the like. Further, each layer of the quantum-well layers 19 and the barrier layers 20 is not limited to a single layer, and may be formed of multiple layers in which such materials are used in combination.

Embodiment 4

Figure 10:
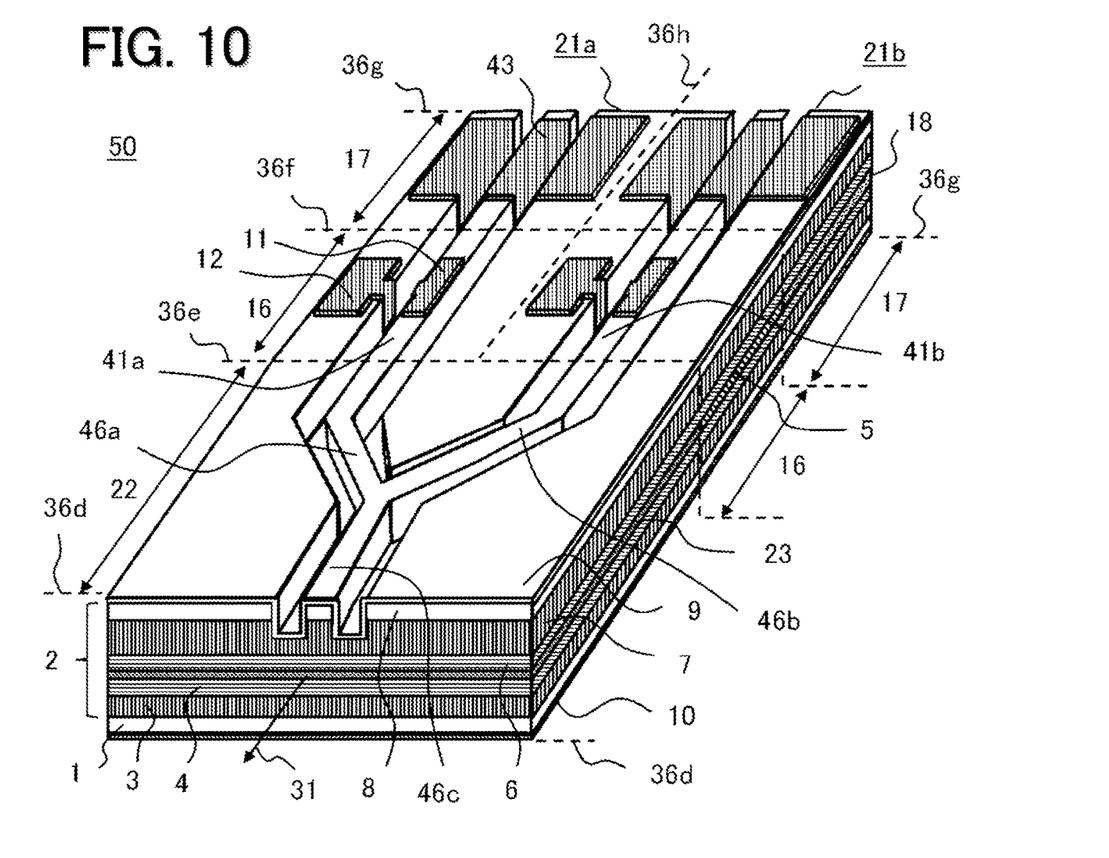
FIG. 10 is a perspective view showing an optical semiconductor device according to Embodiment 4 of the invention.

FIG. 10 is a perspective view showing an optical semiconductor device according to Embodiment 4 of the invention. An optical semiconductor device 50 of Embodiment 4 is an optical semiconductor device in which two second semiconductor lasers 21a, 21b and a Y-shaped coupler 22 that is a coupler for coupling together waveguides for guiding pieces of laser light emitted from the second semiconductor lasers 21a, 21b and having different wavelengths, are integrated on an n-type InP substrate 1, namely, it is a multiple-wavelength integrated optical semiconductor device. The second semiconductor lasers 21a, 21b are each a semiconductor laser with which an electro-absorption modulator is integrated, and specifically, they are each the optical semiconductor device 50 of Embodiment 3 in which the electro-absorption modulator 16 and the semiconductor laser 17 are integrated. This electro-absorption modulator 16 is the same as the electro-absorption modulator 16 of Embodiment 1 or the electro-absorption modulator 16 of Embodiment 2. Note that, in FIG. 10, a case is shown where a light absorbing layer of the electro-absorption modulator 16 is the light absorbing layer 5 in Embodiment 1. The Y-shaped coupler 22 has a transparent waveguide layer 23.

In the Y-shaped coupler 22, a semiconductor stacked structure 2 from an n-type cladding layer 3 to a p-type contact layer 8 corresponds to the structure in the electro-absorption modulator 16 provided that the light absorbing layer 5 is substituted with the transparent waveguide layer 23. The electro-absorption modulator 16 in the second semiconductor laser 21a has a ridge-type waveguide 41a, and the electro-absorption modulator 16 in the second semiconductor laser 21b has a ridge-type waveguide 41b. The Y-shaped coupler 22 has ridge-type waveguides 46a, 46b and 46c. The ridge-type waveguide 41a and the ridge-type waveguide 46a are continuous with each other, and the ridge-type waveguide 41b and the ridge-type waveguide 46b are continuous with each other. The ridge-type waveguide 46c is joined with the ridge-type waveguides 46a, 46b. A broken line 36e is a broken line having portions thereof that are parallel, respectively, to the surface boundary and the boundary on the cross-sectional structure between the transparent waveguide layer 23 and the light absorbing layer 5. A broken line 36f is a broken line having portions thereof that are parallel, respectively, to the surface boundary and the boundary on the cross-sectional structure between the light absorbing layer 5 and the active layer 18. A broken line 36d indicates an end on the side where light is emitted, and a broken line 36g indicates an end on the side where light is incident. Note that, in the left side of FIG. 10, the broken line 36g and the broken line 36d are partly drawn on the upper side (top-face side) of the optical semiconductor device 50, and in the right side of FIG. 10, these lines are partly drawn on the lower side (back-face side) of the optical semiconductor device 50. In the respective broken line 36g and broken line 36d, their portions on the upper face (top face) and the right side-face of the optical semiconductor device 50 are omitted from illustration.

In FIG. 10, the second semiconductor laser 21a corresponds to a region from the broken line 36e to the broken line 36g and to an area on the left side of a broken line 36h. In FIG. 10, the second semiconductor laser 21b corresponds to a region from the broken line 36e to the broken line 36g and to an area on the right side of the broken line 36h. The semiconductor lasers 17 correspond to respective regions in the second semiconductor laser 21a and the second semiconductor laser 21b, from the broken line 36f to the broken line 36g. The electro-absorption modulators 16 correspond to respective regions in the second semiconductor laser 21a and the second semi-conductor laser 21b, from the broken line 36e to the broken line 36f. The Y-shaped coupler 22 corresponds to a region from the broken line 36d to the broken line 36e.

The Y-shaped coupler 22 includes: an n-type InP substrate 1; the semiconductor stacked structure 2 provided on an upper face (top face) of the InP substrate 1; an insulating film 9 made of $SiO_2$ and provided on the semiconductor stacked structure 2; an n-side electrode 10 provided on a lower face (back face) of the InP substrate 1; and a p-side electrode 11 connected to the semiconductor stacked structure 2. The semiconductor stacked structure 2 has: an n-type cladding layer (first coupler cladding layer) 3 made of n-type InP; an i-type InGaAsP light-waveguide layer (first coupler light-waveguide layer) 4; the transparent waveguide layer 23; a p-type light-waveguide layer (second coupler light-waveguide layer) 6 made of p-type InGaAsP; a p-type cladding layer (second coupler cladding layer) 7 made of p-type InP; and a p-type contact layer 8 made of p-type InGaAs; which are stacked on the n-type InP substrate 1 in that order. The first coupler cladding layer (the n-type cladding layer 3), the first coupler light-waveguide layer (the light-waveguide layer 4), the transparent waveguide layer 23; the second coupler light-waveguide layer (the p-type light-waveguide layer 6) and the second coupler cladding layer (the p-type cladding layer 7) in the Y-shaped coupler 22, are connected, respectively, to the first cladding layer (the n-type cladding layer 3), the first light-waveguide layer (the light-waveguide layer 4), the light absorbing layer 5, 45; the second light-waveguide layer (the p-type light-waveguide layer 6) and the second cladding layer (the p-type cladding layer 7) in the electro-absorption modulator 16 of each of the second semiconductor lasers 21a, 21b. The manufacturing steps of the optical semiconductor device 50 of Embodiment 4 are similar to the manufacturing steps of the electro-absorption modulator 16 described in Embodiment 1. However, the light absorbing layer 5 of the electro-absorption modulator 16, the active layer 18 of the semiconductor layer 17 and the transparent waveguide layer 23 of the Y-shaped coupler 22 are not formed simultaneously but formed individually.

Figure 11:
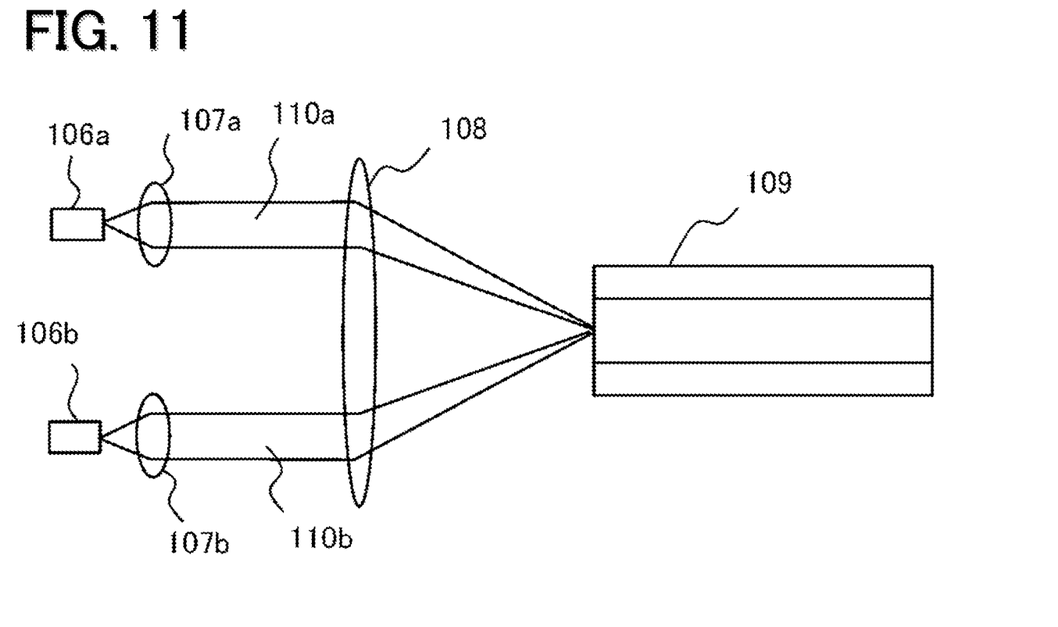
FIG. 11 is a diagram showing an optical communication configuration as a comparative example 2.

Effects of this embodiment will be described as compared to a comparative example. FIG. 11 is a diagram showing an optical communication configuration as a comparative example 2. According to the comparative example 2, respective pieces of light 110a, 110b emitted from multiple semiconductor lasers 106a, 106b are converted into pieces of collimated light by collimating lenses 107a, 107b, and are then coupled into a single optical fiber 109 through a condensing lens 108. When such a configuration as the comparative example 2 is employed, it is difficult to achieve downsizing and further, many works are required for optical adjustment among the semiconductor lasers 106a, 106b, the collimating lenses 107a, 107b, wavelength-selective filters (not shown) and the condensing lens 108 and this is disadvantageous from the viewpoint of working cost.

In contrast, according to the optical semiconductor device 50 (multiple-wavelength integrated optical semiconductor device) of Embodiment 4, plural pieces of laser light having different wavelengths are emitted from the multiple semiconductor lasers 17 formed on a single substrate, and they can be converged on an external point by means of a coupler, for example, the Y-shaped coupler 22 or the like. This makes it possible for the optical semiconductor device 50 of Embodiment 4 to achieve wavelength multiplexing without using a device for multiplexing, such as the collimating lens 107a, 107b, the condensing lens 108 or the like. According to the optical semiconductor device 50 of Embodiment 4, since the multiple semiconductor lasers 17 can be integrated in one chip, it is possible to achieve compact and high-density integration.

According to such a multiple-wavelength integrated optical semiconductor device in which lasers, modulators and a coupler are integrated, namely, the optical semiconductor device 50 of Embodiment 4 in which the semiconductor lasers 17, the electro-absorption modulators 16 and the Y-shaped coupler 22 are integrated, since the structure according to Embodiment 3 is employed for each of the second semiconductor lasers 21a, 21b, it is possible to accomplish effects similar to those in Embodiment 3.

It is noted that, in Embodiment 4, the Y-shaped coupler 22 is used as a coupler for coupling plural pieces of laser light having different wavelengths into a single waveguide; however, other than that, a multi-mode interference (MMI; Multi Mode Interference) waveguide or the like may be used. Further, in Embodiment 4, a case is shown where the optical semiconductor device 50 has two second semiconductor lasers 21a, 21b integrated therein; however, the number of the integrated second semiconductor lasers 21a, 21b may be more than two. For example, the optical semiconductor device may be a four-wavelength integrated optical semiconductor device in which four second semiconductor lasers 21a (or 21b) are integrated.

It is noted that, in Embodiments 1 to 4, the ridge-type waveguide is applied to the structure of each of the electro-absorption modulator 16 and the semiconductor laser 17; however, it may instead be a high mesa-type waveguide obtained by patterning the core layer into a mesa shape. Further, as a buried structure in the stripe-mesa structure of each of the electro-absorption modulator 16 and the semi-conductor laser 17, a semi-insulator-buried hetero (SI-BH) structure or a semi-insulating planar-type buried hetero (PN-BH) structure may be applied. Further, it is also allowable to combine such structures for the electro-absorption modulator 16 and/or the semiconductor laser 17. Further, it is also allowable to apply, other than the multiple quantum-well structure, a bulk structure, a quantum wire structure, a quantum dot structure or any combined structure thereof, to the light absorbing layer 5 of the electro-absorption modulator 16 and the active layer 18 of the semiconductor laser 17.

Embodiment 5

Figure 12:
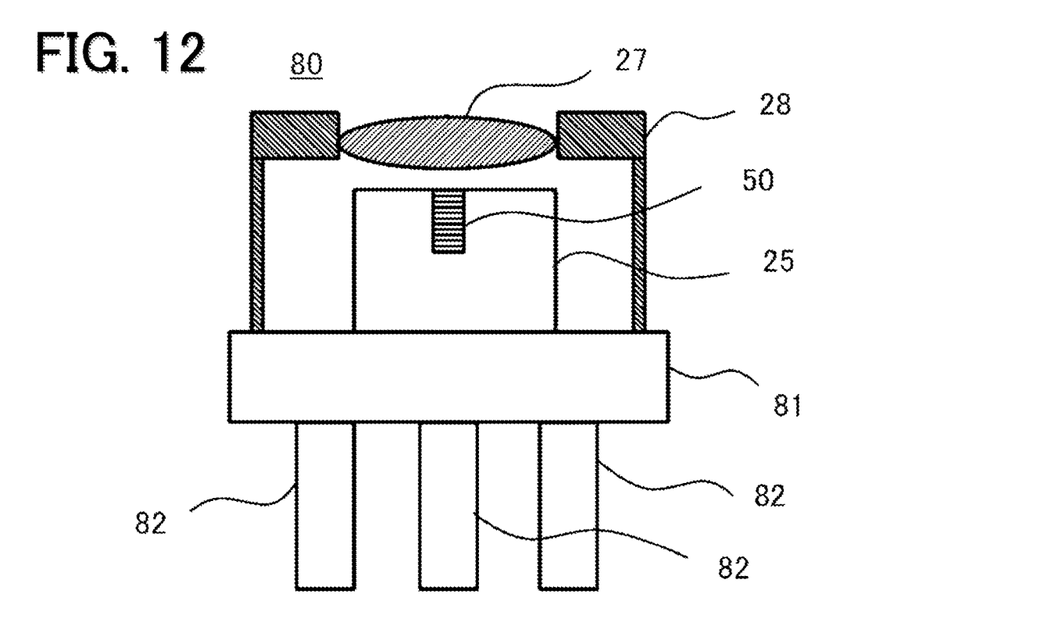
FIG. 12 is a diagram showing an optical module according to Embodiment 5 of the invention.

FIG. 12 is a diagram showing an optical module according to Embodiment 5 of the invention. An optical module 80 of Embodiment 5 includes: an optical semiconductor device 50; a chip carrier 25 on which the optical semiconductor device 50 is mounted; a stem 81 on which the chip carrier 25 is mounted; a lens 27; a lens holder 28 holding the lens 27 and covering the top-face side of the stem 81; and terminals 82 connected to the optical semiconductor device 50. The lens holder 28 is placed on the stem 81 so as to cover the optical semiconductor device 50 and the chip carrier 25. In FIG. 12, the lens 27 and the lens holder 28 are shown as cross-sections. The optical semiconductor device 50 has been mounted using an AuSn solder on the chip carrier 25 made of aluminum nitride (AlN) and equipped with a termination resistor of 50Ω. The chip carrier 25 has, for example, a plate-like shape. The stem 81 is a cylindrical packaging base, and the material of the stem 81 is a metal member such as a steel plate cold commercial (SPC) or the like. The terminals 82 are each passing through or connected to the stem 81.

When, in such an optical module 80, the structure according to Embodiment 3 or 4 is employed for the optical semiconductor device 50 as an optical device, it is possible to accomplish effects similar to those in Embodiment 3 or 4.

Figure 13:
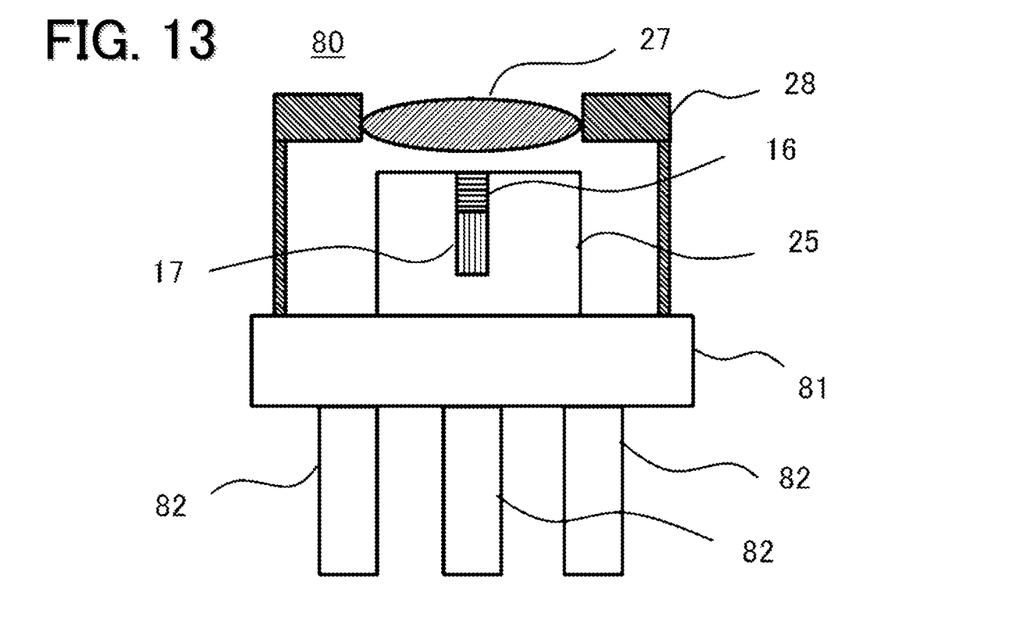
FIG. 13 is a diagram showing another optical module according to Embodiment 5 of the invention.

Further, in the optical module 80, the electro-absorption modulator 16 of Embodiment 1 or 2 may instead be mounted. FIG. 13 is a diagram showing another optical module according to Embodiment 5 of the invention. The other optical module 80 shown in FIG. 13 includes: an electro-absorption modulator 16; a semiconductor laser 17; a chip carrier 25 on which the electro-absorption modulator 16 and the semiconductor laser 17 are mounted; a stem 81 on which the chip carrier 25 is mounted; a lens 27; a lens holder 28 holding the lens 27 and covering the top-face side of the stem 81; and terminals 82 connected to the electro-absorption modulator 16 and the semiconductor laser 17. The lens holder 28 is placed on the stem 81 so as to cover the electro-absorption modulator 16, the semiconductor laser 17 and the chip carrier 25. When, in the optical module 80 shown in FIG. 13, the structure according to Embodiment 1 or 2 is employed for the electro-absorption modulator 16 as an optical device, it is possible to accomplish effects similar to those in Embodiment 1 or 2.

As described above, the optical module 80 of Embodiment 5 comprises: the stem 81; the chip carrier 25 mounted on the stem 81; the optical device (electro-absorption modulator 16, optical semiconductor device 50) mounted on the chip carrier 25; and the lens holder 28 holding the lens 27 and placed on the stem 81 so as to cover the optical device (electro-absorption modulator 16, optical semiconductor device 50) and the chip carrier 25. The optical device in the optical module 80 of Embodiment 5 is the electro-absorption modulator 16 of Embodiment 1 or 2, or the optical semiconductor device 50 of Embodiment 3 or 4. According to the optical module 80 of Embodiment 5, the light absorbing layer 5 in the optical device (electro-absorption modulator 16, optical semiconductor device 50) is comprised of a ternary or more complex III-V semiconductor mixed crystal that does not contain Al but contains Bi, or the quantum-well layers 13 in the light absorbing layer 45 are each comprised of a ternary or more complex III-V semiconductor mixed crystal that does not contain Al but contains Bi. Since in the optical device (electro-absorption modulator 16, optical semiconductor device 50), the light absorbing layer 5 or the quantum-well layer 13 in the light absorbing layer 45 is comprised of a ternary or more complex III-V semiconductor mixed crystal that does not contain Al but contains Bi, the optical module 80 of Embodiment 5 is less temperature-dependent and can improve its reliability.

Embodiment 6

Figure 14:
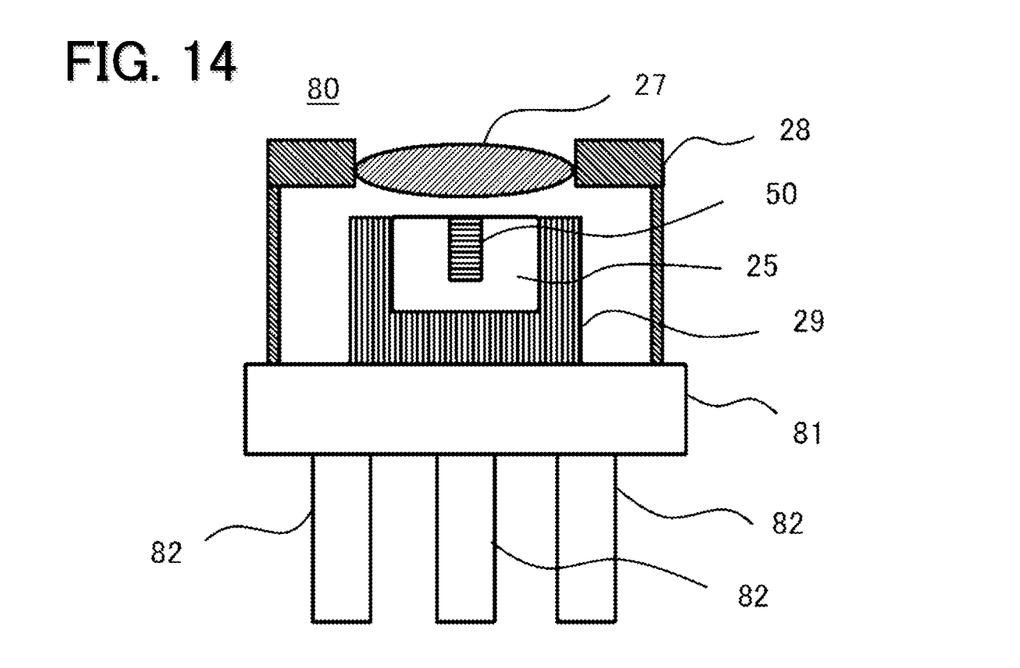
FIG. 14 is a diagram showing an optical module according to Embodiment 6 of the invention.

FIG. 14 is a diagram showing an optical module according to Embodiment 6 of the invention. An optical module 80 of Embodiment 6 includes: an optical semiconductor device 50; a chip carrier 25 on which the optical semiconductor device 50 is mounted; a temperature adjustment system 29 such as a Peltier cooler or the like, attached to the chip carrier 25; a stem 81 on which the temperature adjustment system 29 and the chip carrier 25 are mounted; a lens 27; a lens holder 28 holding the lens 27 and covering the top-face side of the stem 81; and terminals 82 connected to the optical semiconductor device 50, etc. The lens holder 28 is placed on the stem 81 so as to cover the optical semiconductor device 50, the chip carrier 25 and the temperature adjustment system 29. In FIG. 14, the lens 27 and the lens holder 28 are shown as cross-sections. The optical semiconductor device 50 has been mounted using an AuSn solder on the chip carrier 25 made of aluminum nitride (AlN) and equipped with a termination resistor of 50Ω. The optical module 80 of Embodiment 6 differs from the optical module 80 of Embodiment 5 in that it is provided with the temperature adjustment system 29 and the chip carrier 25 is mounted on the temperature adjustment system 29. In the terminals 82, there is also a terminal connected to the temperature adjustment system 29.

When, in such an optical module 80, the structure according to Embodiment 3 or 4 is employed for the optical semiconductor device 50 as an optical device, it is possible to accomplish effects similar to those in Embodiment 3 or 4. Namely, even if temperature adjustment is not performed for the optical semiconductor device 50 by the temperature adjustment system 29, the optical module 80 of Embodiment 6 can accomplish the effects similar to those in Embodiment 3 or 4. Further, according to the optical module 80 of Embodiment 6, as described in Embodiment 3, it is possible, by changing the temperature of the optical semiconductor device 50 by the temperature adjustment system 29, to change the oscillation wavelength of the semiconductor laser 17 while keeping the absorption wavelength of the electro-absorption modulator 16 unchanged. According to the optical module 80 of Embodiment 6, it is possible, by temperature modulation, to compensate a deviation of ΔΔ between the oscillation wavelength of the semiconductor laser 17 and the absorption wavelength of the electro-absorption modulator 16, that is due to an error in their production, so that the required production accuracy is mitigated.

Figure 15:
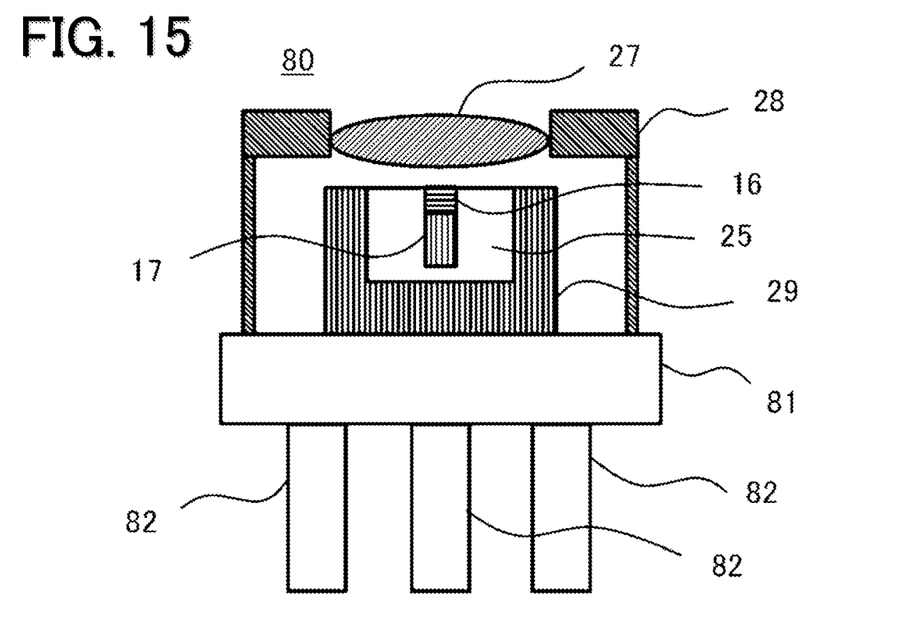
FIG. 15 is a diagram showing another optical module according to Embodiment 6 of the invention.

Further, in the optical module 80, the electro-absorption modulator 16 of Embodiment 1 or 2 may instead be mounted. FIG. 15 is a diagram showing another optical module according to Embodiment 6 of the invention. The other optical module 80 shown in FIG. 15 includes: an electro-absorption modulator 16; a semiconductor laser 17; a chip carrier 25 on which the electro-absorption modulator 16 and the semiconductor laser 17 are mounted; a temperature adjustment system 29 such as a Peltier cooler or the like, attached to the chip carrier 25; a stem 81 on which the temperature adjustment system 29 and the chip carrier 25 are mounted; a lens 27; a lens holder 28 holding the lens 27 and covering the top-face side of the stem 81; and terminals 82 connected to the electro-absorption modulator 16, the semiconductor laser 17, etc. The lens holder 28 is placed on the stem 81 so as to cover the electro-absorption modulator 16, the semiconductor laser 17, the chip carrier 25 and the temperature adjustment system 29. When, in the optical module 80 shown in FIG. 15, the structure according to Embodiment 1 or 2 is employed for the electro-absorption modulator 16 as an optical device, it is possible to accomplish effects similar to those in Embodiment 1 or 2. Namely, even if temperature adjustment is not performed for the electro-absorption modulator 16 by the temperature adjustment system 29, the optical module 80 of Embodiment 6 can accomplish the effects similar to those in Embodiment 1 or 2.

Further, according to the other optical module 80 of Embodiment 6 shown in FIG. 15, when the structure according to Embodiment 1 or 2 is employed for the electro-absorption modulator 16 as an optical device, and the laser structure according to Embodiment 3 or 4 is employed for the semiconductor laser 17 as an optical device, it is possible, by changing the temperatures of the electro-absorption modulator 16 and the semiconductor laser 17 by the temperature adjustment system 29, to change the oscillation wavelength of the semiconductor laser 17 while keeping the absorption wavelength of the electro-absorption modulator 16 unchanged, as described in Embodiment 3. According to the other optical module 80 of Embodiment 6, it is possible, by temperature modulation, to compensate a deviation of ΔΔ between the oscillation wavelength of the semiconductor laser 17 and the absorption wavelength of the electro-absorption modulator 16, that is due to an error in their production, so that the required production accuracy is mitigated.

As described above, the optical module 80 of Embodiment 6 comprises: the stem 81; the temperature adjustment system 29 mounted on the stem 81; the chip carrier 25 mounted on the temperature adjustment system 29; the optical device (optical semiconductor device 50, electro-absorption modulator 16 as a single device, semiconductor laser 17 as a single device) mounted on the chip carrier 25; and the lens holder 28 holding the lens 27 and placed on the stem so as to cover the optical device (optical semiconductor device 50, electro-absorption modulator 16 as a single device, semiconductor laser 17 as a single device), the chip carrier 25 and the temperature adjustment system 29. In the optical module 80 of Embodiment 6, the light absorbing layer 5 in the optical device (optical semiconductor device 50, electro-absorption modulator 16 as a single device) is comprised of a ternary or more complex III-V semiconductor mixed crystal that does not contain Al but contains Bi, or the quantum-well layer 13 in the light absorbing layer 45 is comprised of a ternary or more complex III-V semiconductor mixed crystal that does not contain Al but contains Bi. Furthermore, in the optical module 80 of Embodiment 6, the active layer 18 in the optical device (semiconductor laser 17 in the optical semiconductor device 50, semiconductor laser 17 as a single device) is comprised of a ternary or more complex III-V semiconductor mixed crystal that does not contain Bi. Since in the optical device, the light absorbing layer 5 or the quantum-well layer 13 in the light absorbing layer 45 is comprised of a ternary or more complex III-V semiconductor mixed crystal that does not contain Al but contains Bi, the optical module 80 of Embodiment 6 is less temperature-dependent and can improve its reliability. Further, according to the optical module 80 of Embodiment 6, it is possible, by changing the temperature of the optical device (electro-absorption modulator 16, optical semiconductor device 50) by the temperature adjustment system 29, to change the oscillation wavelength of the semiconductor laser 17 while keeping the absorption wavelength of the electro-absorption modulator 16 unchanged.

It is noted that, in Embodiment 5 and Embodiment 6, a coaxial-type semiconductor optical module in a form of CAN package is employed as the optical module 80; however, it may instead be a TOSA (Transmitter Optical Sub-Assembly) in which a receptacle with a built-in isolator and a flexible board are provided, or the like.

It should be noted that unlimited combination of the respective embodiments and any appropriate modification and omission in the embodiments may be made in the present invention to the extent without causing contradiction.

DESCRIPTION OF REFERENCE NUMERALS AND SIGNS

1: InP substrate, 3: n-type cladding layer, 6: p-type light-waveguide layer, 7: p-type cladding layer, 13: quantum-well layer, 14: barrier layer, 15: barrier layer, 16: electro-absorption modulator, 17: semi-conductor laser, 18: active layer, 21a, 21b: second semiconductor laser, 22: Y-shaped coupler, 23: transparent waveguide layer, 25: chip carrier, 27: lens, 28: lens holder, 29: temperature adjustment system, 33: incident light, 45: light absorbing layer, 50: optical semiconductor device, 80: optical module, 81: stem.

The invention claimed is:

1. An electro-absorption modulator which is formed on an InP substrate and modulates incident light according to a voltage applied to that modulator, said electro-absorption modulator comprising:
   a light absorbing layer for absorbing a portion of the incident light by using an electric field generated by the applied voltage; wherein
   the light absorbing layer is comprised of a ternary or more complex III-V semiconductor mixed crystal that does not contain Al but contains Bi and that is lattice-matched to the InP substrate.

2. The electro-absorption modulator of claim 1, wherein the light absorbing layer has a multiple quantum-well structure in which quantum-well layers and barrier layers are stacked alternately, and the quantum-well layers are each comprised of the ternary or more complex III-V semiconductor mixed crystal that does not contain Al but contains Bi.

3. An electro-absorption modulator which is formed on an InP substrate and modulates incident light according to a voltage applied to that modulator, said electro-absorption modulator comprising:
   a light absorbing layer for absorbing a portion of the incident light by using an electric field generated by the applied voltage; wherein
   the light absorbing layer has a multiple quantum-well structure in which quantum-well layers and barrier layers are stacked alternately;
   the quantum-well layers are each comprised of a ternary or more complex III-V semiconductor mixed crystal that does not contain Al but contains Bi and that is lattice-matched to the InP substrate; and
   the barrier layers are each comprised of a ternary or more complex III-V semiconductor mixed crystal that does not contain Bi but contains Al.

4. The electro-absorption modulator of claim 1, wherein the light absorbing layer is comprised of InGaAsBi.

5. The electro-absorption modulator of claim 2, wherein the quantum-well layers are each comprised of InGaAsBi.

6. The electro-absorption modulator of claim 1, wherein the light absorbing layer is comprised of InGaPBi.

7. The electro-absorption modulator of claim 2, wherein the quantum-well layers are each comprised of InGaPBi.

8. The electro-absorption modulator of claim 1, wherein the light absorbing layer is comprised of InGaAsPBi.

9. The electro-absorption modulator of claim 2, wherein the quantum-well layers are each comprised of InGaAsPBi.

10. The electro-absorption modulator of claim 1, which comprises:
    a first cladding layer formed on a surface of the InP substrate;
    a first light-waveguide layer formed on a surface of the first cladding layer;
    the light absorbing layer formed on a surface of the first light-waveguide layer;
    a second light-waveguide layer formed on a surface of the light absorbing layer; and
    a second cladding layer formed on a surface of the second light-waveguide layer.

11. An optical semiconductor device which comprises the electro-absorption modulator of claim 10 and a semiconductor laser that is formed on the InP substrate on which the electro-absorption modulator is formed, said semiconductor laser comprising:
    a first laser cladding layer formed on a surface of the InP substrate;
    a first laser light-waveguide layer formed on a surface of the first laser cladding layer;
    an active layer formed on a surface of the first laser light-waveguide layer;
    a second laser light-waveguide layer formed on a surface of the active layer; and
    a second laser cladding layer formed on a surface of the second laser light-waveguide layer; wherein
    the first laser cladding layer, the first laser light-waveguide layer, the active layer, the second laser light-waveguide layer and the second laser cladding layer are connected, respectively, to the first cladding layer, the first light-waveguide layer, the light absorbing layer, the second light-waveguide layer and the second cladding layer in the electro-absorption modulator.

12. An optical semiconductor device which comprises the electro-absorption modulator of claim 1 and a semiconductor laser that is formed on the InP substrate on which the electro-absorption modulator is formed, wherein
    an active layer of the semiconductor laser is connected to the light absorbing layer of the electro-absorption modulator.

13. An optical semiconductor device in which two or more optical semiconductor devices each being said optical semiconductor device of claim 11, are integrated on a single said InP substrate.

14. An optical semiconductor device in which two or more second semiconductor lasers that are each provided as the optical semiconductor device of claim 12, are integrated on a single said InP substrate, and a coupler that couples together waveguides for guiding pieces of laser light emitted from the second semiconductor lasers and having different wavelengths, is integrated on the single said InP substrate.

15. An optical semiconductor device in which two or more second semiconductor lasers that are each provided as the optical semiconductor device of claim 11, are integrated on a single said InP substrate, and a coupler that couples together waveguides for guiding pieces of laser light emitted from the second semiconductor lasers and having different wavelengths, is integrated on the single said InP substrate.

16. The optical semiconductor device of claim 15, wherein the coupler comprises:
    a first coupler cladding layer formed on a surface of the InP substrate;
    a first coupler light-waveguide layer formed on a surface of the first coupler cladding layer;
    a transparent waveguide layer formed on a surface of the first coupler light-waveguide layer;
    a second coupler light-waveguide layer formed on the transparent waveguide layer; and
    a second coupler cladding layer formed on a surface of the second coupler light-waveguide layer; and
    the first coupler cladding layer, the first coupler light-waveguide layer, the transparent waveguide layer, the second coupler light-waveguide layer and the second coupler cladding layer are connected, respectively, to the first cladding layer, the first light-waveguide layer, the light absorbing layer, the second light-waveguide layer and the second cladding layer in the electro-absorption modulator of each of the second semiconductor lasers.

17. An optical module, comprising:
    a stem; a chip carrier mounted on the stem; an optical device mounted on the chip carrier; and a lens holder holding a lens and placed on the stem so as to cover the optical device and the chip carrier; wherein
    the optical device is the electro-absorption modulator of claim 1.

18. The optical module of claim 17, wherein no Peltier cooler is mounted.

19. An optical module, comprising:
    a stem;
    a temperature adjustment system mounted on the stem;
    a chip carrier mounted on the temperature adjustment system;
    an optical device mounted on the chip carrier; and
    a lens holder holding a lens and placed on the stem so as to cover the optical device, the chip carrier and the temperature adjustment system; wherein
    the optical device is the optical semiconductor device of claim 11, and the active layer in the semiconductor laser is comprised of a ternary or more complex III-V semiconductor mixed crystal that does not contain Bi.

20. An optical module, comprising:
    a stem;
    a chip carrier mounted on the stem;
    an optical device mounted on the chip carrier; and
    a lens holder holding a lens and placed on the stem so as to cover the optical device and the chip carrier; wherein
    the optical device is the optical semiconductor device of claim 11.

\* \* \* \* \*